United States Patent [19]

Pryor et al.

[11] Patent Number: 4,612,618
[45] Date of Patent: Sep. 16, 1986

[54] HIERARCHICAL, COMPUTERIZED DESIGN OF INTEGRATED CIRCUITS

[75] Inventors: Richard L. Pryor, Voorhees, N.J.; William M. Cowhig, Philadelphia, Pa.

[73] Assignee: RCA Corporation, Princeton, N.J.

[21] Appl. No.: 503,042

[22] Filed: Jun. 10, 1983

[51] Int. Cl.[4] .......................................... G06F 15/606
[52] U.S. Cl. .................................... 364/490; 364/488
[58] Field of Search .............................. 364/488–491; 307/303

[56] References Cited

U.S. PATENT DOCUMENTS 4,377,849  3/1983  Finger et al. ...................... 364/491
4,484,292  11/1984  Hong et al. ......................... 364/491
4,523,106  6/1985  Tanizawa et al. .................. 364/490

OTHER PUBLICATIONS

IBM J. Res. Development, May 1981 (V 25, No. 3), "Bipolar Circuit Design for a 5000-Circuit VLSI Gate Array", Dansky, pp. 116–125.

IEEE Spectrum, Jun. 1982 (V 19, No. 6), "Automating Chip Layout", S. Trimberger, pp. 38–45.

17th Design Automation Conference Proc., Jun. 1980, "The Genealogical Approach to the Layout Problem", Szepieniec et al., pp. 535–542, published by ACM.

"Building Block Approach and Variable Size Memory for CMOS VLSIs" by Koide et al., Feb. 1983, IEEE International Solid-State Circuits Conference, pp. 148–149 of the Proceedings.

Primary Examiner—Errol A. Krass
Assistant Examiner—Kevin J. Teska
Attorney, Agent, or Firm—Joseph S. Tripoli; Robert L. Troike; Robert Ochis

[57] ABSTRACT

High gate count integrated circuits (ICs) are designed in a heirarchical manner. In a first pass through a computer design system basic cells are composed to form one-level-up building block cells. In a second pass through the same computer design system the one-level-up building block cells are used as "basic" cells and composed to form a two-level-up structure which may be a building block cell or a chip.

16 Claims, 7 Drawing Figures

HIERARCHICAL, COMPUTERIZED DESIGN OF INTEGRATED CIRCUITS

The present invention relates to computerized design of integrated circuits and more particularly to hierarchical design techniques.

Our related application Ser. No. 503,043, filed June 10, 1983, entitled "HIERARCHICAL INTEGRATED CIRCUITS", filed simultaneously with this application, is incorporated herein by reference.

In this specification a "random logic circuit" means a logic circuit which is not a predictable repetition of a basic logic structure. Over the years, the gate count of random logic digital ICs has increased to the point where 4,000 to 6,000 gates are often found in a single IC. As many as 20,000 gates will be needed in the near future. Such large random logic circuits are extremely complex and when designed by hand require amounts of design time which are essentially prohibitively large. Therefore, such circuits are usually designed using a computerized design system which essentially comprises a computer and the appropriate software. There is currently commercially available, from a variety of sources, application software for providing the automatic placement of circuit elements and the routing of conductors for IC's of the general type under consideration.

With such computerized design systems, if the IC contains more than a threshold number of logic gates, then the efficiency of semiconductor area utilization decreases substantially with increasing numbers of gates and the computer run time necessary to design the IC increases drastically. For some design techniques, the threshold number of gates is in the range from 600 to 1,000 gates. An IC wit 6,000 gates designed with such systems may have as much as nine times as large an area devoted to interconnections among logic gates as is devoted to the logic gates themselves. This is an inefficient utilization of the semiconductor material. The resulting large chip sizes carry with them increased semiconductor material costs and a reduced yield of good circuits. In addition, the design of such a 6,000 gate IC using a computerized design system whose threshold number of gates is in the 600 to 1,000 gate range may require weeks or months of actual computer run time. This is an extremely inefficient use of computer resources and is an undesirably long design cycle for an IC.

A computerized IC design technique is needed for high-gate-count ICs which produces designs which provide more efficient utilization of the semiconductor material and which requires substantially less computer resources for the design of an IC and which accomplishes that design in a substantially reduced time.

The present invention overcomes these prior art problems by providing a hierarchical computerized technique for designing high-gate-count ICs. In accordance with one embodiment of the invention, the IC's logic network is partitioned into a plurality of first-level building blocks which are comprised of second-level building blocks. The second-level building blocks are designed as cells having a basic cell interconnection format. A basic cell interconnection format is one which enables the computerized system to compose a number of such cells to form a larger structure. The computerized system designs the IC by composing second-level building block cells which comprise a given first-level building block to form that first-level building block as a cell having a basic cell interconnection format. Once all of the first-level building block cells have been designed, the computerized system composes them to form the IC in a chip format. A chip format is one which is suitable for connection to off-chip circuitry. The resulting chip is a mosaic of hierarchical building block cells in which building block cells, independent of their hierarchical level, have the same interconnection format and are arranged in a common composition format in composing their portion of the next higher level structure.

The design of an integrated circuit (IC) is begun by determining the functions the IC is to perform. Once those functions have been determined a logic network or circuit is devised which will produce those functions. This logic network realization of the IC's functions is then translated into a design for an integrated circuit chip either by hand or through use of a computerized design system. Such a computerized design system can be interactive or fully automatic. One such prior art computerized design system to which the present invention is applicable is the MP2D (multi-port 2-dimensional) automatic computerized design system (version 5.2, 1982) developed by the RCA Corporation. In the sense of MP2D, multi-port means that each signal connection to a cell is available at more than one location (preferably at two opposing sides) as a means of simplifying the wiring necessary to interconnect the cells. This invention is also applicable to many other computerized chip design systems.

Where the MP2D design system is to be used for the design of an IC, it is preferred that the logic network realization be specified in terms of cells of a family of basic (primitive), pre-designed cells which MP2D will utilize in designing the IC. Use of a family of such cells with a computerized design system enables that system to operate on the basis of these basic primitive cells, rather than the substantially more numerous individual active and passive components needed to provide the IC's functions. This use of basic cells allows a computer having a given degree of sophistication to design more complex ICs than it could using individual components. Each basic primitive cell of the family is generally equivalent to one logic gate. There are normally in the range of 20 to 70 or more different basic, primitive, cells in a cell family. The resulting wide variety of cells facilitates efficient use of semiconductor area by providing minimum area realizations of many types of logic gatesin a number of configurations. Automatic design software, such as MP2D, includes device placement routines, device interconnection routing routines and so forth which are directly used to design the IC. That design is then checked using associated design rule checking routines, logic simulation routines and so forth.

Figure 1:
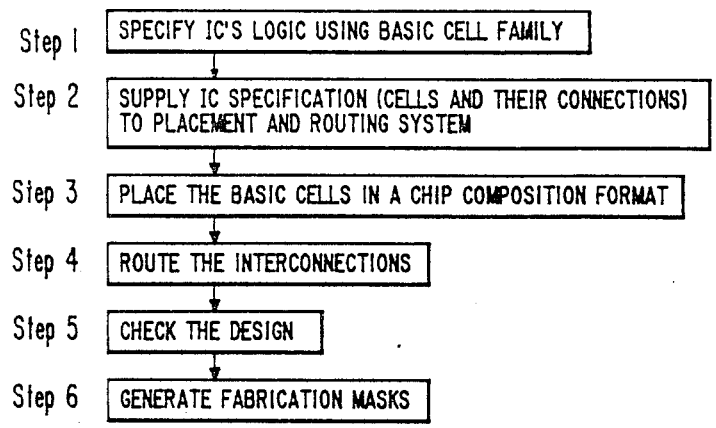
FIG. 1 illustrates a prior art technique for computerized design of integrated circuits.

The prior art design process is illustrated in flow chart form in FIG. 1. Step 1 is the preliminary step of devising and specifying the logic network of the IC using the planned basic cell family. In the second step of the process that IC network specification (in terms of the basic cells to be utilized and the connections among them) is provided to the computerized placement and routing system which is to design the IC chip. In the third step, the computerized system places the basic cells in a chip composition format. The details of that chip composition format depend on the design system being used. With MP2D this basic cell placement-step involves iterative manipulation of basic cell locations to provide a compact chip and to facilitate the routing of interconnections among the cells. In the fourth step, the interconnections among the various cells are routed by the computerized system. This essentially completes the design of the IC. In the fifth step of the process, that completed design is checked using software routines which check for violations of physical design rules, logical errors, timing problems within the circuit and so forth. Once this checking has been completed, the masks necessary for fabrication of the final, error-free, design for that IC are generated in the sixth and final step of the design process.

As long as there are fewer logic gates in the IC than the computerized design system's threshold number of logic gates, the design system produces an IC design which makes efficient use of semiconductor area. This can be with as much as 50% of the chip area devoted to the basic cells. For ICs having fewer than the threshold number of gates, the IC design is produced very rapidly. As the number of logic gates increases substantially beyond the threshold number, the resulting designs make much less efficient use of the semiconductor area of the final IC and the computer run times necessary to produce the design increase drastically. This increased-run-time effect is most drastic on a cell placement routine which uses a trial and error pair exchange technique to place the basic cells in a manner which (1) provides a compact IC and (2) minimizes the complexity of the conductors which interconnect the various basic cells. The number of such possible pair exchanges is proportional to the factorial of the number of basic cells (gates) in the IC. Thus, the increase in the number of exchanges and the computer run time are both factorial in nature. A factorial curve has a much sharper knee and increases much more rapidly above the knee than an exponential curve does. It is this effect which can result in an IC having 6,000 gates requiring weeks or months of actual computer running time for its design. Under such conditions the overall time to design an IC and get it into production can easily exceed a year.

Figure 2:
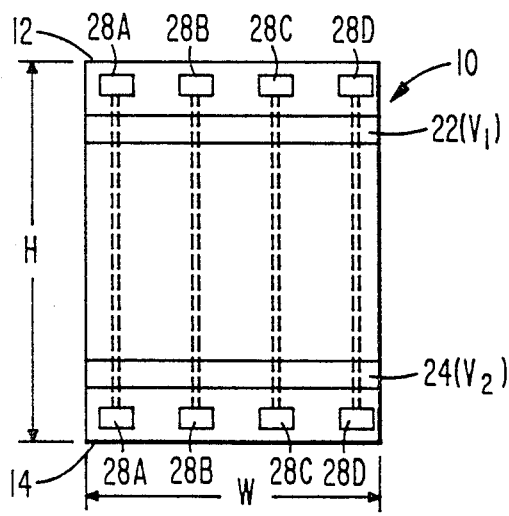
FIG. 2 illustrates a prior art basic cell and its interconnection format.

A prior art basic cell 10 is illustrated in FIG. 2. This cell cell has (that is, conforms to) a basic cell interconnection format which is suitable for use with the MP2D program. The cell is rectangular, has a height H and a width W and has two rows of interconnection pin pads 28, one along an upper edge 12 of the cell and one along a lower edge 14 of the cell. There are locations for two power buses 22 and 24 for providing voltages $V_1$ and $V_2$, respectively to the cell.

As used in this specification the term "format" is a fairly broad term, thus, although the term "basic cell interconnection format" is explained with reference to the cell 10 in FIG. 2, it is not, in its broad sense, limited to the specific pattern shown in FIG. 2. Rather, the term "basic cell interconnection format" covers a whole group of similar configurations which are specifiable in a related manner to meet the requirements of the design program to be used. The definition of a cell of a family of cells like cell 10 involves specifying the size of the cells, the number, the location and the size of pin pads 28 in the upper and lower rows, and the location of the upper power bus 22 and the lower power bus 24 and the widths of these power buses. This basic cell interconnection format and its specification ignore the details of the interior configuration of the cell. Information about that configuration is not needed for placing cells and routing interconnections because those design actions do not depend on any details of the internal structure of the cell. For the MP2D program the basic cell interconnection format of basic cell 10 includes the connection within the cell of corresponding pin pads in the upper and lower rows (e.g. the two pins 28A, the two pins 28B, etc.). This facilitates routing of interconnections by allowing any connection to the cell to be made either to the upper edge or the lower edge of the cell. For MP2D, all of the cells in a given basic cell family have the same height H to facilitate their placement in rows having a uniform row height.

Figure 3:
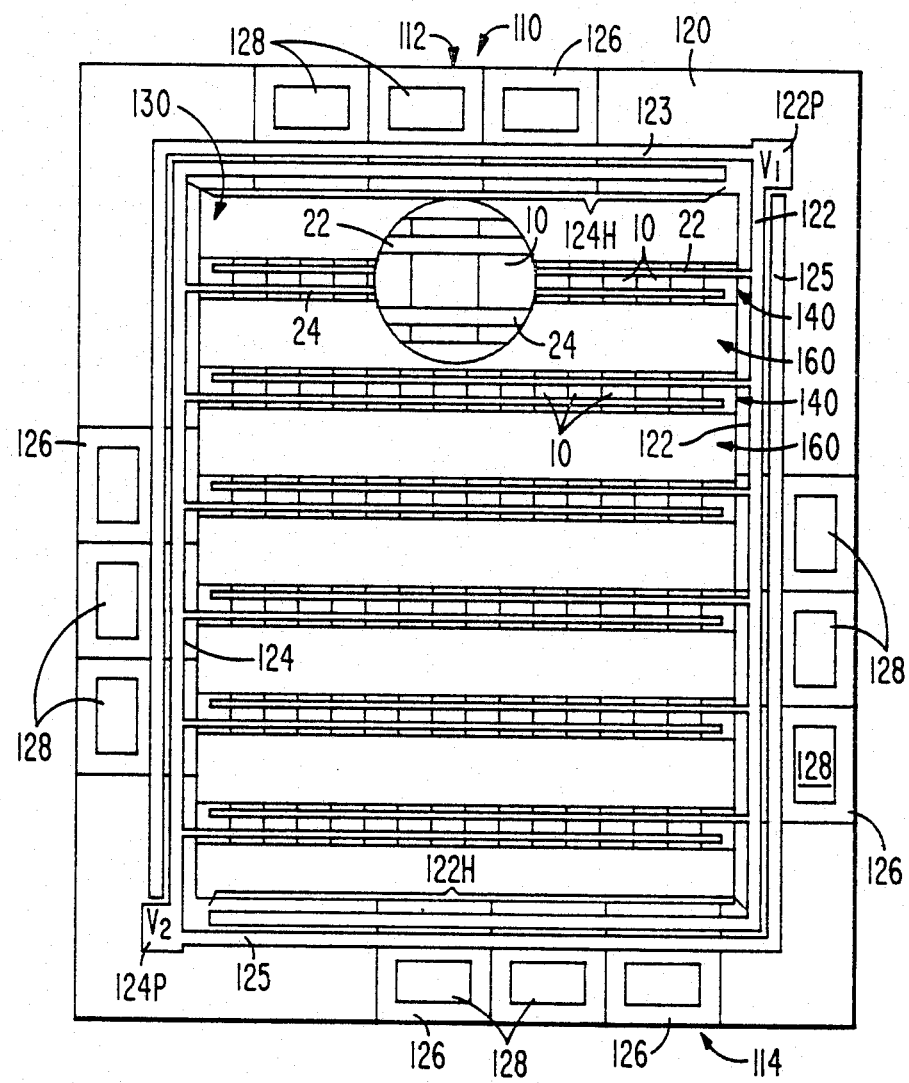
FIG. 3 illustrates a prior art chip composed from basic cells like that in FIG. 2 via the design process of FIG. 1.

In designing an IC chip, such as chip 110 in FIG. 3, the MP2D program places the basic cells 10 included in the IC's logic network in an interior region 130 of the chip in a composition format. This composition format comprises a plurality of parallel, horizontal cell rows 140 spaced apart by horizontal wiring channels 160 in which interconnecting wiring (not shown) is located. The number of rows of cells and the number of cells per row both depend on the complexity of the IC being designed.

A $V_1$ row power bus 22 and a $V_2$ row power bus 24 extend along each row 140 of cells 10. The individual cell 10 power buses 22 ($V_1$) and 24 ($V_2$) (FIG. 2) are the portions of the corresponding row power bus which overlies that cell.

Surrounding the interior region 130 of the chip is a peripheral region 120 in which the chip's main power buses 122 and 124 are located. Each row $V_1$ power bus 22 connects to the chip $V_1$ power bus 122 and each row $V_2$ power bus 24 connects to the chio $V_2$ power bus 124. The peripheral area 120 also contains ancillary power buses 123 ($V_1$) and 125 ($V_2$) and pad cells 126. Each of the chip power buses (122 and 124) has a portion (122h and 124h, respectively) which extends horizontally (parallel to the length of the cell rows 140). The ancillary buses 123 and 125 have similar parallel-to-the-cell-rows portions. Each pad cell 126 has a unique function which is not duplicated by other pad cells. Each pad cell has its own input/output (I/O) connection pad 128 and provides an interface function to off-chip circuitry. The interface functions may include input coupling, output coupling, over voltage protection, voltage level translation, current level translation and so forth. Pad cells 126 obtain their power across a main power bus ($V_1$ or $V_2$) and an ancillary power bus ($V_2$ or $V_1$). Pad cells 126 and I/O pads 128 are located along all four edges of the chip. O pads 128 are sized to enable the connection of external circuitry thereto (using techniques such as wire bonding).

The chip format of chip 110 is characterized by the location of connection pads along all four edges of the chip; the presence of external contact pads 122P and 124P attached to the power buses 122 and 124; and the presence in the peripheral region of ancillary power buses and power bus portions extending parallel to the length of the cell rows. The chip format may be specified in terms of the size of the chip, the size of the external connection pads, the location of the first pad along each side of the chip, the center-to-center spacing of the pads and so forth.

The basic cell interconnection format of cell 10 of FIG. 2 is different from the chip format of FIG. 3, inter alia, because of the inclusion of pads along all four sides of chip 110 in FIG. 3, the differing configurations of the power buses in the cell and the chip (the power bus on the chip does not extend from one edge of the chip all the way to the opposite edge of the chip as it does in the cell, the cell lacks the ancillary buses and power bus portions in the peripheral region which extend parallel to the cell rows) and so forth.

Figure 4:
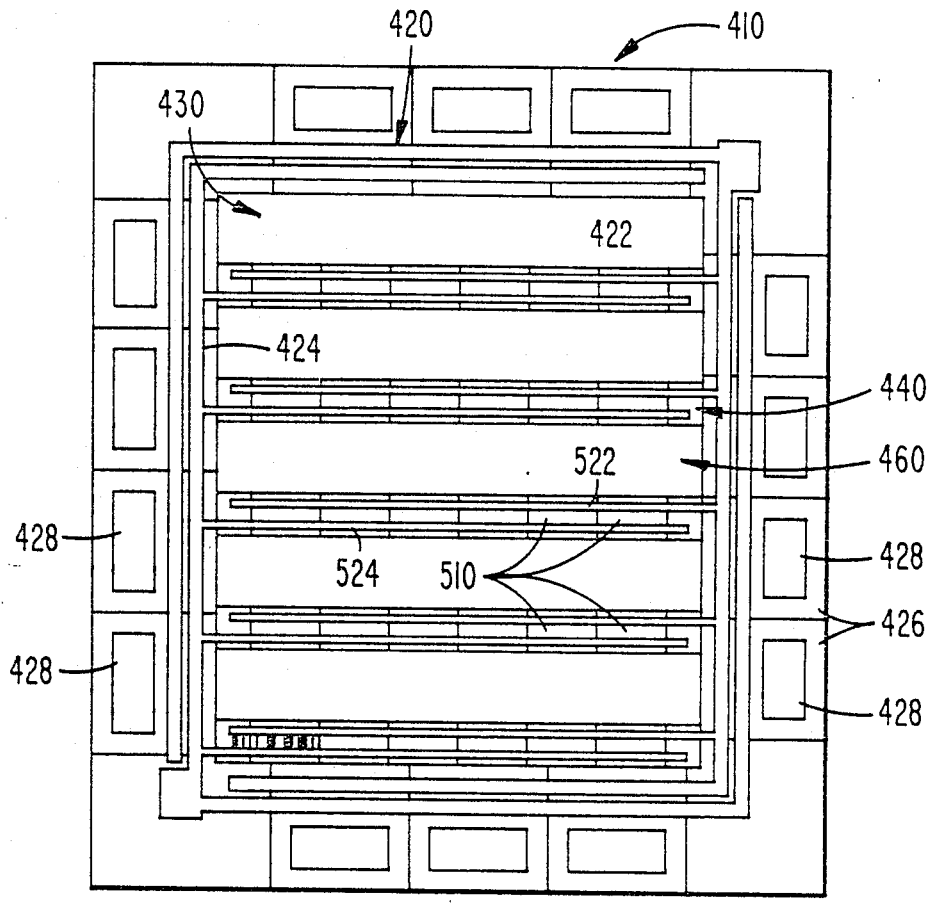
FIG. 4 illustrates a chip designed in accordance with the present invention and having two hierarchical levels of building block cells therein.

The present invention overcomes the prior art problems of inefficient semiconductor utilization and excessive computer run times for the design of high-gate-count ICs by designing high gate count ICs in a hierarchical manner. This hierarchical design process produces a chip 410 (FIG. 4) having a structure which is a mosaic of hierarchical building block cells. Chip 410 has an interior region 430 having the composition format—i.e. parallel rows 440 of (the highest hierarchical level building block) cells, with those rows spaced apart by wiring corridors 460. The peripheral region 420 of chip 410 is similar to that of chip 110 and has pad cells 426 having connection pads 428.

Figure 5:
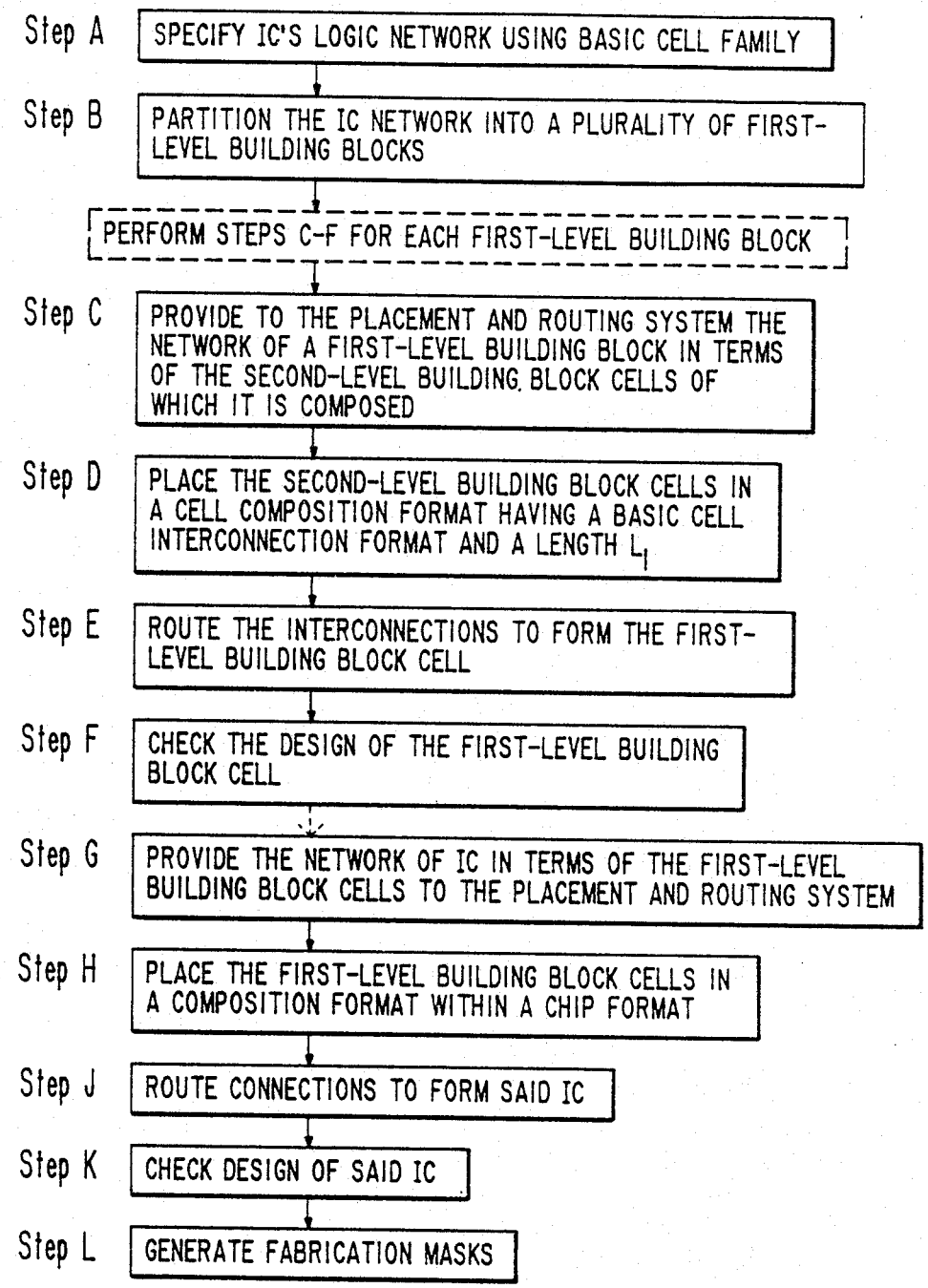
FIG. 5 illustrates a computerized process in accordance with the present invention for designing an IC in a hierarchical manner.

A hierarchical process for designing a hierarchical IC having two different hierarchical levels of building block cells is illustrated in FIG. 5. This process provides its primary benefits over the prior art where the number of logic gates in the IC is two or more times the threshold number, such that run times and semiconductor utilization inefficiencies are becoming a significant problem in the prior art process. The design process begins with a preliminary step (step A) of specifying the IC's logic network using basic cells of the family to be utilized in fabricating the IC.

In accordance with the invention the second step (B) of the process is partitioning that realization of the IC's logic network into a plurality of first level building blocks. The partitioning step may be performed as part of the process of devising the logic network or after the logic network has been completely specified. The partitioning may be done by hand or with a computerized partitioning system.

Each of these first-level building blocks which are defined by this partition preferably has less than the threshold number of basic cells therein. The basic cells within a given first-level building block should have a high degree of interconnection among themselves and relatively little connection to other basic cells. This minimizes the interconnection wiring needed among first-level building blocks during the layout of the final IC structure and conserves semiconductor area. The partitioning of the IC logic network is often most effective if done in accordance with a block diagram of the logic of the IC. Basic cells within a block of the IC block diagram tend to have a greater interconnection among themselves than to cells in other blocks of the diagram.

Figure 6:
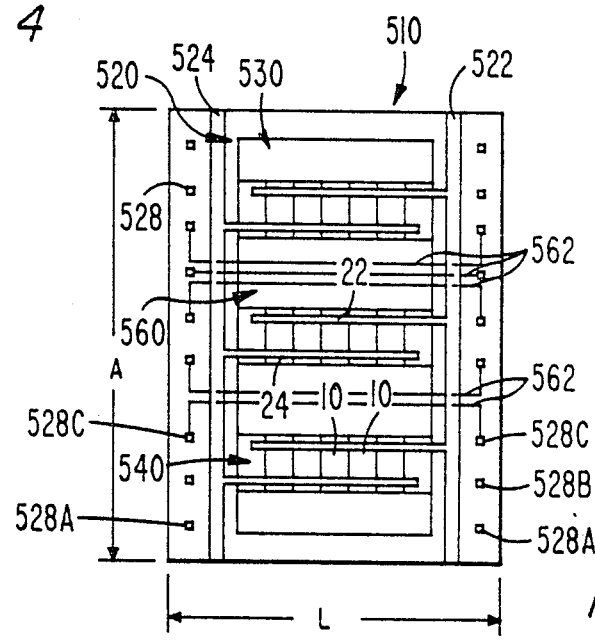
FIG. 6 illustrates a first-level building block cell designed in accordance with the present invention and comprised of second-level basic cells.

Once the IC's logic network has been partitioned into a plurality of first-level building blocks, the design process proceeds with the design of each first-level building block in the set of steps C-F which are performed separately for each first-level building block. The steps C-F of this process are similar to the steps 2-5 of the prior art process of FIG. 1. Steps C-F differ from the prior art in that the system is constrained to produce a cell design having a basic cell interconnection format rather than the chip format of the prior art process. This constraint forces the system to produce a structure for the first-level cells which the design system can handle in the manner of a basic cell. This constraint may be by setting parameters within the software, or by other means. The computerized design system in steps C-F is preferably the MP2D system, but it should be possible to use the methodology of the present invention with other software systems. In Step C the computerized placement and routing system is provided with the specification for a given first-level building block. This specification is in terms of the second-level building block cells (basic cells 10 in this case) of which that first-level building block is comprised. In step D the system places the second-level building block cells 10 in a composition format within a first-level cell having a basic cell interconnection format. A representative cell of this type is shown as 510 in FIG. 6. This process of placing basic cells may be an iterative process as has been described in connection with the prior art process of FIG. 1. The cell 510 has a length L parallel to the length of the cell rows 540 of the composition format and an altitude A perpendicular thereto.

Once a particular placement of the second-level building block cells has been settled upon, the process proceeds to its step E where the interconnections are routed among the second-level cells within that first-level building block and to the connection pin pads 528 of that cell 510. These connections include conductors 562 connecting corresponding pin pads 528 on opposite sides of the cell 510 so that the cells 510 will have the basic cell interconnection format (i.e. a format like that of basic cell 10).

In step F of the process, the design of the given first-level building block cell is checked. Once the design of the given first-level building block cell 510 has been completed and checked, that building block cell may be set aside until the rest of the first-level building block cells have been designed and checked. The cell 510 has a central region 530 having the composition format of parallel rows of the next lower level hierarchical structure (basic cells 10 in this case). These rows are spaced apart by wiring corridors 560. This is the same composition format as in prior art chips. The peripheral region 520 of the cell 510 is substantially different from the peripheral region of a chip in that it has no pad cells, has pin pads which are much smaller than the external connection pads of a chip and has a power bus structure which is different from that of a chip. This bus structure includes a $V_1$ cell bus 522 and a $V_2$ cell bus 524 each of which extends the full altitude A of the cell. Row $V_1$ buses 22 and $V_2$ buses 24 connect to cell buses 522 and 524, respectively.

Direct feed throughs can be built into the cells 510 as they are being designed for use, if needed, during subsequent composition employing those cells. Alternatively, the cells 510 may be designed without direct feed throughs and feed throughs may be added during subsequent composition when such feed throughs are needed for signal routing.

The design of the various first-level building block cells may be done in succession in a single computer or may be done in parallel using a plurality of computers or parallel processing. The design of each first-level building block cell is performed rapidly so long as that cell contains fewer than the threshold number of logic gates. Even with multiplying the time to design a first-level building block cell by the number of such cells, the total computer run time for design of the IC is drastically reduced compared to prior art techniques.

Once all of the first level building block cells 510 have been designed the process proceeds to step G in which the computer-based placement and routing system (preferably the one which designed the first level building block cells) 510 receives a specification of the IC 410 in terms of those first level building block cells and their interconnections. In step H the computer-based system places the first level building block cells in a composition format within a chip format. In so doing, the cells 510 are rotated 90° (relative to their orientation in FIG. 6) to present them to the computer based system in the normal basic cell interconnection format in which the rows of pin pads are horizontal. As a result of the 90° rotation of the building block cells 510, the length L of a cell 510 during composition becomes the height H of the building block cell 510 during its use as a "basic cell" for the composition of the overall IC. Similarly, the altitude A during composition of the cell 510 becomes the width W of the building block cell 510 during composition of the next higher level structure (the IC). During the design of the first-level building block cells the computerized design system is preferably constrained to produce building block cells all of which have a fixed, common length $L_1$ in the direction parallel to the length of their cell rows. In this way, when those building block cells are composed (after 90° rotation) to form a next higher level structure, they will fit in rows 440 of uniform height $H_1$. Any differences in the number of gates in different first-level building block cells and any differences in the width of basic cells therein are reflected through differences in the altitude (width when rotated 90°) of different first-level building block cells.

The cell placement process is facilitated if each of the first level building block cells is roughly the same size whereby those cells are easily interchanged among rows during the iterative placement process.

In step J the system routes the interconnections (1) among first-level building block cells 510 and (2) between cells 510 and pad cells 426. This completes the design of the IC. In the step K this IC design is checked. During this checking, it is only necessary to check the design of the IC in the terms of first-level building block cells since each of the first-level cells was checked as the final step of its own design. The final step (L) of the design process is the generation of fabrication masks from which an actual IC can be fabricated. These fabrication masks are drastically different from masks produced by the prior art process for the identical logic network and cell family. As a result, the IC chip produced using these masks is also drastically different from that produced using the prior art process and its masks. These differences normally include a smaller chip, a different pattern of power bus distribution, a mosaic of hierarchical cells and so forth. Thus, from a given initial logic network definition this design process produces an IC structure which is substantially different from the IC structure produced by the prior art process.

One of the benefits of this hierarchical design technique is that the power buses at each hierarchical level are made to have a width which is sufficient to meet its power requirements without the buses at any particular level being substantially wider than needed. This contrasts with the prior art where wide buses are used everywhere because all active cells are connected directly to row power buses.

Where the same computerized design system, including software, is used both for the design of the first-level building block cells from the basic cells and for design of the IC from the first-level building block cells, the inventive design process recycles the output of the process at one hierarchical level as the "basic" cell family (input) for the process at the next higher hierarchical level.

Figure 7:
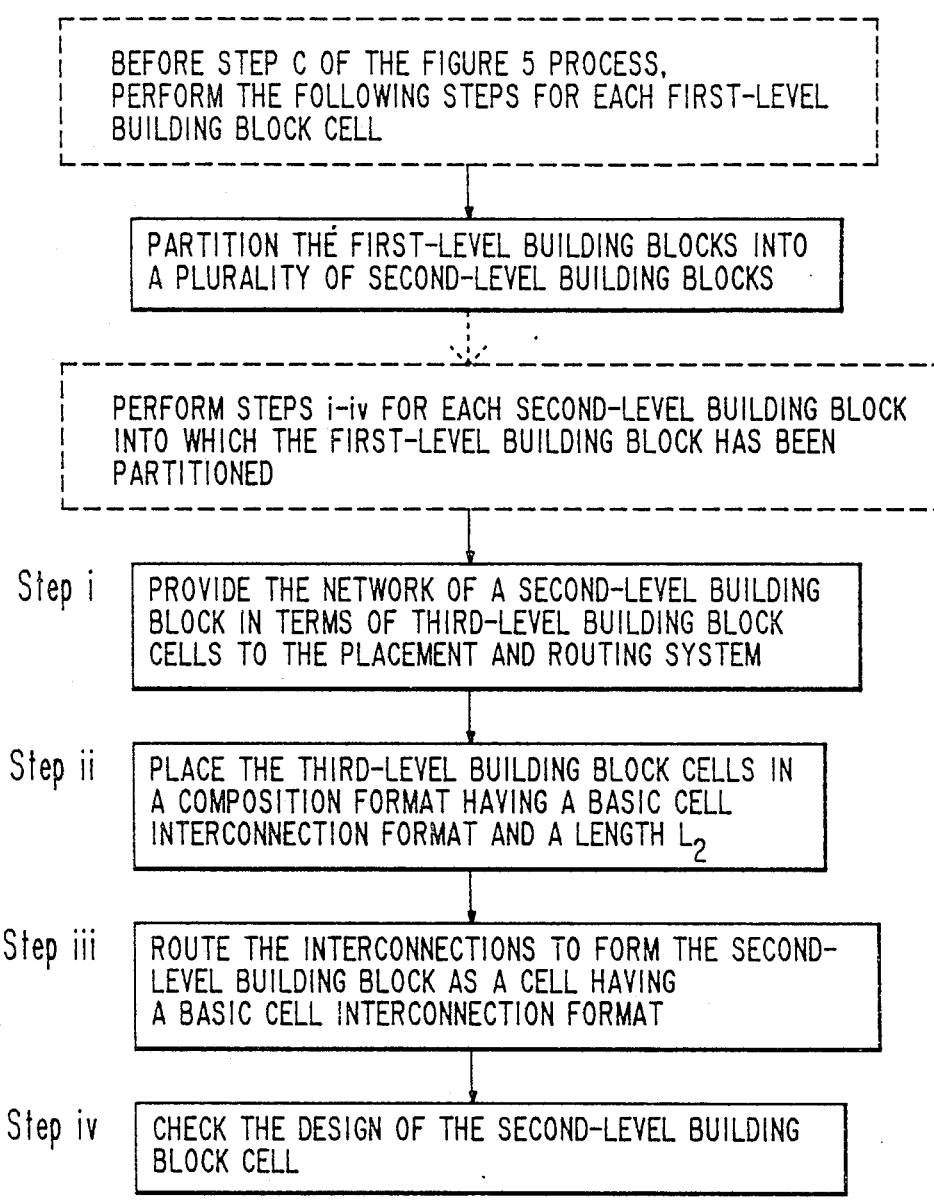
FIG. 7 illustrates a modification of the process of FIG. 5 for hierarchically processing IC designs in a process involving more than two hierarchical levels.

If an IC network includes a sufficiently large number of gates (in the neighborhood of the threshold number squared), then a three-level hierarchical design process is needed for efficient design of that IC. Such a three hierarchical level chip design process may be provided by modifying the process of FIG. 5 in accordance with the flow chart of FIG. 7. This yields a chip design which includes three hierarchical levels of building block cells. In the three-level process, either as part of the partitioning step (step B) of the FIG. 5 process, or as a separate step, each first-level building block is partitioned into a plurality of second-level building blocks. Each of the second-level building blocks preferably contains a number of basic cells which is less than the threshold number for the computerized design system in use. Once this partition has been achieved, each second-level building block is designed in accordance with Steps i through iv of FIG. 7.

In Step i, the specification of a given second-level building block in terms of third-level building block cells (basic cells here) is provided to the computerized design system. This is preferably the same computerized system as is used in the process of FIG. 5.

In Step ii the design system places the third-level building block cells in a composition format within a basic cell interconnection format to provide the second-level building block cells. To facilitate composition of the second-level building block cells into first-level building block cells, the second-level cells should be composed to all have the same length $L_2$. When composed with a common length $L_2$, these cells (after 90° rotation) will have a common height $H_2$, when being composed into first-level cells.

In Step iii, the system routes the interconnections among the third-level building block cells and the pin pads of the second-level cell. This completes the design of that second-level building block cell.

In Step iv, that completed design is checked using the software checking routines. That second-level cell is then set aside for later use in composing the first-level cell it will be part of. Each of the second-level building blocks undergoes the process of steps i through iv. This process may be performed in series on the successive second-level building blocks in a single computer or in parallel through the use of multiple computers or parallel processing. Once all of the second-level building block cells have been designed, the process of the design continues with step C of the FIG. 5 process where each of the first-level building blocks is processed through steps C–F separately in the manner described above in connection with the two-level hierarchical design of an IC.

When large numbers of first and/or second level cells are needed in the design of ICs and there is a substantial degree of commonality among designs, the design effort for each IC can be reduced. This is done by designing a family of building block cells which are one level up from basic cells. The design of the logic networks of ICs is then done in terms of that one-level-up cell family. Alternatively, each hierarchical cell may be added to a hierarchical cell library when that cell's design is finalized. Either of these techniques reduces the number of iterations which the software must go through in designing the IC.

What is claimed is:

1. In a computer process for designing an IC by composing a semiconductor chip having a chip from a plurality of basic cells, each selected from a family of basic cells in which each cell conforms to a first common basic cell interconnection format which enables said computer process to arrange a plurality of said cells in a row and which defines the locations in said cell to which said process must to able to route conductors in the process of designing said IC, chip format being different from said basic cell interconnection format, the improvement comprising the steps of:
   (a) composing an arrangement of a plurality of said basic cell to define a higher order building block cell conforming to a second common basic cell interconnection format, like said first common basic cell interconnection format but with larger overall dimensions; and
   (b) performing step (a) a plurality of times to create a family of said higher order building block cells each of which conforms to said second common basic cell interconnection format whereby said higher order buidling block cells are themselves composible in the same manner by said computer process into still higher order structures.

2. The improvement recited in claim 1 further comprising the step of:
   (c) composing an arrangement of a plurality of said higher order building block cells to define a still higher order structure.

3. The improvement recited in claim 2 wherein:
   step (a) includes first placing said basic cells in a composition format in which said basic cells are arranged in a plurality of parallel rows within said higher order building block cell being created; and
   step (c) includes second placing said higher order building block cells in said composition format in which said higher order building block cells are arranged in a plurality of parallel rows within said still higher order structure being created.

4. The improvement recited in claim 2 wherein:
   step (c) produces said still higher order structure in conformance with a third common basic cell interconnection format like said second commom basic cell interconnection format, but with larger overall dimensions whereby a plurality of said still higher order structures comprise a family of still higher order building block cells which are themselves composible by said computer process in the same manner into even higher order structures.

5. The improvement recited in claim 3 wherein:
   step (c) produces said still higher order structure with a chip format having a inner portion in which said building block cells are arranged in said composition format and an outer portion surrounding said inner portion, said outer portion including circuits designed for connection to conductors which are external to said chip.

6. The improvement recited in claim 3, wherein:
   said second placing step includes orienting each building block cell with length of the rows of basic cells therein oriented substantially perpendicular to the length of the row of building block cells in which said building block cell is located within said still higher order structure.

7. The improvement recited in claim 6 wherein:
   said basic cells are rectangular and said basic cell interconnection format includes a first row of interconnection pin pads along a first side of said basic cell, a second row of interconnection pin pads along a second, opposing side of said cell and third and fourth sides of said basic cell which are free of interconnection pin pads; and
   each pin pad in said first row has a functionally equivalent pin pad in said second row.

8. The improvement recited in claim 7 wherein:
   said functionally equivalent pins are directly electrically connected to each other.

9. The improvement recited in claim 8 wherein:
   said basic cell interconnection format includes first and second power buses each extending from said third side to said fourth side of basic cell.

10. The improvement recited in claim 9 wherein:
    said basic cell interconnection format includes all of the cells of a given family having the same height from said first side to said second side and permits different cells of said given family to have different widths from said third side to said fourth side.

11. The improvement recited in claim 10 wherein:
    said step of first placing said basic cells includes arranging each of said basic cells within a row contiguous to the adjacent basic cell within that row; and
    said step of second placing said building block cells includes arranging each of said building block cells within a row contiguous to the adjacent building block cell within that row.

12. A computer process comprising the steps of:
    employing a computerized design system to compose, from a family of basic cells each of which conforms to a first common basic cell interconnection format, a family of building block cells each of which is one hierarchical level up from said basic cells and which conforms to a second common basic cell interconnection format like said first common basic cell interconnection format but with larger overall dimensions; and
    employing said computerized design system to compose, from said family of one-level-up building block cells a structure which is two hierarchical levels up from said basic cells.

13. The computer process recited in claim 12 wherein:
    said basic cells are rectangular and each of said basic cell interconnection formats includes a first row of interconnection pin pads along a first side of said basic cell and a second row of interconnection pin pads along a second, opposing side of said cell; and each pin pad in said first row has a functionally equivalent pin pad in said second row.

14. The computer process recited in claim 13 wherein:
    said functionally equivalent pins are directly electrically connected to each other.

15. The computer process recited in claim 13 wherein:
    third and fourth sides of said basic cells are free of interconnection pin pads.

16. A computer process for designing an integrated circuit chip comprising:
    composing an arrangement of a plurality of building block cells from a first family of building block cells in which each building block cell conforms to a first common basic cell interconnection format to define a building block cell of a second, higher order family of building block cells in which each building block cell conforms to a second common basic cell interconnection format like said first common basic cell interconnection format, but with larger overall dimensions;
    performing said composing step a plurality of times to create a plurality of said building block cells in said second, higher order, family; and
    recycling said second family of building block cells through said design system to compose said integrated circuit chip from said building block cells of said second family.

* * * * *